United States Patent
Zhang et al.

(10) Patent No.: US 10,269,647 B2
(45) Date of Patent: Apr. 23, 2019

(54) SELF-ALIGNED EPI CONTACT FLOW

(71) Applicant: Applied Materials, Inc., Santa Clara, CA (US)

(72) Inventors: Ying Zhang, Santa Clara, CA (US); Schubert S. Chu, San Francisco, CA (US); Xinyu Bao, Fremont, CA (US); Regina Germanie Freed, Los Altos, CA (US); Hua Chung, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/811,188

(22) Filed: Nov. 13, 2017

(65) Prior Publication Data
US 2018/0211881 A1    Jul. 26, 2018

Related U.S. Application Data

(60) Provisional application No. 62/448,886, filed on Jan. 20, 2017.

(51) Int. Cl.
| | |
|---|---|
| *H01L 21/8234* | (2006.01) |
| *H01L 29/417* | (2006.01) |
| *H01L 29/66* | (2006.01) |
| *H01L 29/78* | (2006.01) |
| *H01L 21/8238* | (2006.01) |

(52) U.S. Cl.
CPC ............. *H01L 21/823431* (2013.01); *H01L 21/823821* (2013.01); *H01L 29/41791* (2013.01); *H01L 29/66795* (2013.01); *H01L 29/7831* (2013.01)

(58) Field of Classification Search
None
See application file for complete search history.

(56) References Cited

U.S. PATENT DOCUMENTS

| | | | |
|---|---|---|---|
| 2012/0091528 A1 | 4/2012 | Chang et al. | |
| 2014/0001520 A1 | 1/2014 | Glass et al. | |
| 2015/0171193 A1* | 6/2015 | Cheng | H01L 21/823431 438/197 |
| 2016/0049516 A1 | 2/2016 | Huang et al. | |

(Continued)

FOREIGN PATENT DOCUMENTS

KR   10-2016-0130524 A    11/2016

OTHER PUBLICATIONS

PCT Notification of Transmittal of the International Search Report and the Written Opinion of the International Searching Authority for International Application No. PCT/US2018/012968; dated May 8, 2018; 10 total pages.

*Primary Examiner* — Asok K Sarkar
(74) *Attorney, Agent, or Firm* — Patterson + Sheridan LLP

(57) ABSTRACT

Methods for forming semiconductor devices, such as Fin-FETs, are provided. In one embodiment, a method for forming a FinFET device includes removing a portion of each fin of a plurality of fins, and a remaining portion of each fin is recessed from a dielectric surface. The method further includes forming a feature on the remaining portion of each fin, filling gaps formed between adjacent features with a dielectric material, removing the features, and forming a fill material on the remaining portion of each fin. Because the shape of the features is controlled, the shape of the fill material can be controlled.

20 Claims, 6 Drawing Sheets

(56) References Cited

U.S. PATENT DOCUMENTS

2016/0233321 A1* 8/2016 Ching .................. H01L 29/785
2016/0372470 A1   12/2016 Ok et al.
2017/0098584 A1*  4/2017 Bu ..................... H01L 29/6681

* cited by examiner

SELF-ALIGNED EPI CONTACT FLOW

CROSS-REFERENCE TO RELATED APPLICATIONS

This application claims benefit of U.S. Provisional Patent Application Ser. No. 62/448,886 filed Jan. 20, 2017, which is incorporated herein by reference.

BACKGROUND

Field

Embodiments described herein generally relate to methods for forming semiconductor devices, and more particularly to methods for forming fin field effector transistors (FinFETs).

Description of the Related Art

As circuit densities increase for next generation devices, the widths of interconnects, such as vias, trenches, contacts, gate structures and other features, as well as the dielectric materials therebetween, decrease to 22 nm or smaller dimensions, whereas the thickness of the dielectric layers remain substantially constant, with the result of increasing the aspect ratios of the features. Recently, complementary metal oxide semiconductor (CMOS) FinFET devices have been widely used in many logic and other applications and are integrated into various different types of semiconductor devices.

FinFET devices typically include semiconductor fins with high aspect ratios in which the channel and source/drain regions for the transistor are formed thereover. A gate electrode is then formed over and alongside of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow.

To improve transistor performance, stressor materials may fill source/drain areas, and the stressor materials may grow in source/drain areas by epitaxy. The epitaxial film is faceted by (111) planes and has a diamond shape along the transistor channel direction. In other words, the epitaxial film may extend laterally and form facets. With the scaling down of transistors, fin pitch (distance between adjacent fins) is getting smaller. This may cause the reduction in the distance between an epitaxial film grown on a fin and an epitaxial film grown on an adjacent fin, which may cause adjacent epitaxial films to merge. The merged epitaxial films decreases the effect of epitaxial films on the strain in the transistor channel, and defects may form easily at the junction of the merged area.

Therefore, there is a need for an improved method for forming FinFETs.

SUMMARY

Methods for forming semiconductor devices, such as FinFETs, are provided. In one embodiment, a method includes removing a portion of each fin of a plurality of fins formed on a semiconductor substrate to expose a surface of a remaining portion of each fin, wherein the surface is recessed from a surface of a first dielectric material formed adjacent to each fin, forming a feature on the surface of the remaining portion of each fin, filling gaps between adjacent features with a second dielectric material, removing the features to form a plurality of openings in the second dielectric material, wherein the surface of the remaining portion of each fin is exposed.

In another embodiment, a method includes epitaxially forming a feature on each exposed portion of a plurality of exposed portions of a semiconductor surface, wherein the feature comprises a compound semiconductor material, wherein the exposed portions are separated by a first dielectric material disposed on covered portions of the semiconductor surface, filling gaps between adjacent features with a second dielectric material, removing the features to form a plurality of openings in the second dielectric material, wherein the surface of the exposed portions of the semiconductor surface are uncovered, and depositing a fill material within each opening.

In another embodiment, a method includes removing semiconductor pillars to form a plurality of trenches in a dielectric material formed adjacent to the semiconductor pillars, wherein a semiconductor surface comprising a fin material is exposed in each trench, forming a conductive source or drain material on each exposed semiconductor surface, wherein each source or drain material is formed within a corresponding trench of the plurality of trenches, and forming a metal contact over each source or drain material, wherein the metal contact and a corresponding source or drain material are aligned within a corresponding trench of the plurality of trenches.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Methods for forming semiconductor devices, such as FinFETs, are provided. In one embodiment, a method for forming a FinFET device includes removing a portion of each fin of a plurality of fins, and a remaining portion of each fin is recessed from a dielectric surface. The method further includes forming a feature on the remaining portion of each fin, filling gaps formed between adjacent features with a dielectric material, removing the features, and forming a fill material on the remaining portion of each fin. Because the shape of the features is controlled, the shape of the fill material can be controlled.

Figure 1:
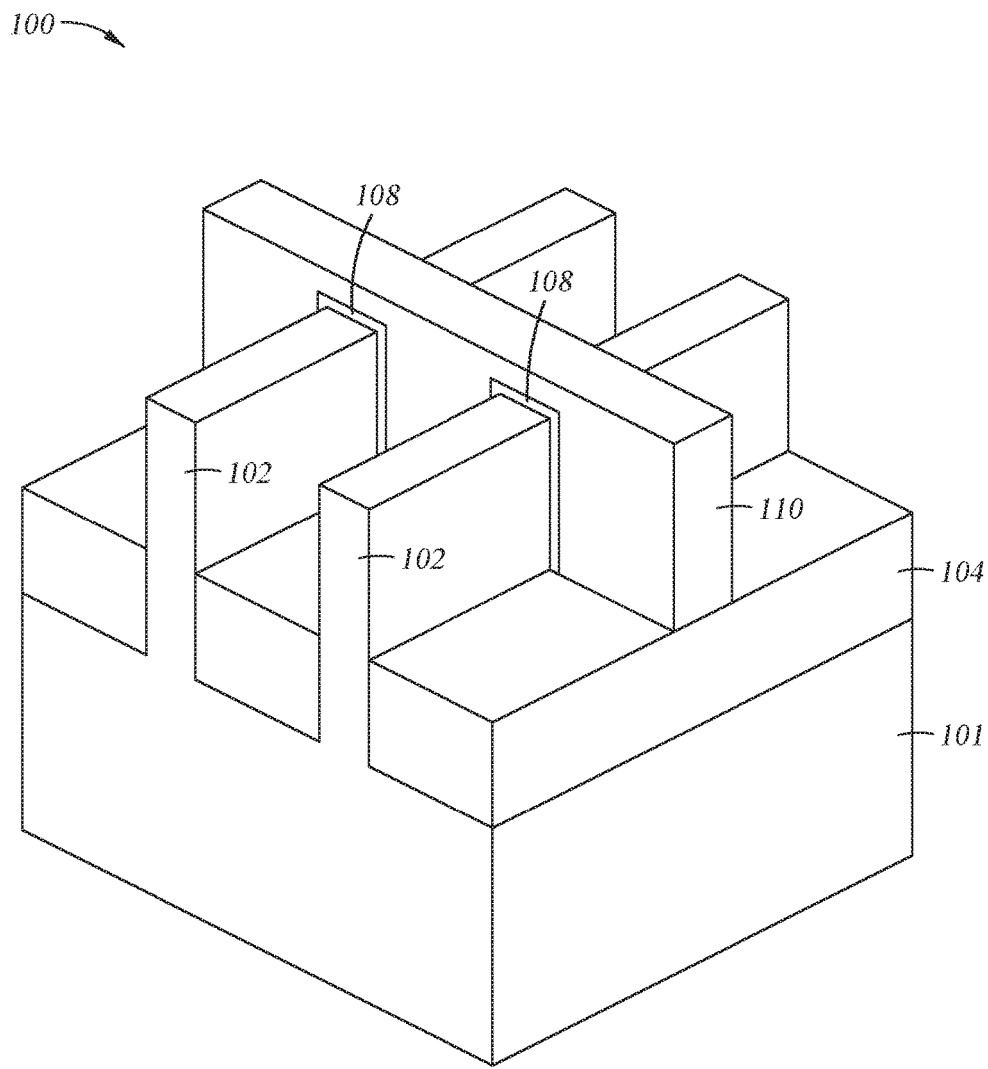
FIG. 1 is a perspective view of a semiconductor structure according to one embodiment described herein.

FIG. 1 is a perspective view of a semiconductor structure 100 according to one embodiment described herein. The semiconductor structure 100 may include a substrate 101, a plurality of fins 102 (only two are shown, but the structure may have more than two fins), a dielectric material 104 disposed between adjacent fins 102 on the substrate 101, and a gate electrode 110 disposed on the dielectric material 104 and over a portion of each fin 102. The substrate 101 may be a bulk silicon substrate, and may be doped with a p-type or an n-type impurity. Other substrate materials include, but are not limited to, germanium, silicon-germanium, and other similar materials. The plurality of fins 102 may be fabricated from the same material as the substrate 101. The dielectric material 104 may form isolation regions, such as shallow trench isolation (STI) regions, and may include silicon oxide, silicon nitride, silicon oxynitride, silicon carbonitride, or any other suitable dielectric material. As shown in FIG. 1, each of the plurality of fins 102 extends a distance above the upper surface of the dielectric material 104. A gate dielectric 108 is formed between the gate electrode 110 and the plurality of fins 102. The gate dielectric 108 facilitates electrical isolation between the gate electrode 110 and the plurality of fins 102. The gate dielectric 108 may be fabricated from silicon nitride, silicon oxide, hafnium oxide, hafnium silicon oxynitride, hafnium silicate, hafnium silicon oxide, or any other convenient gate dielectric material. The gate electrode 110 may be fabricated from polysilicon, amorphous silicon, germanium, silicon germanium, metals, or metal alloys.

Figure 2A:
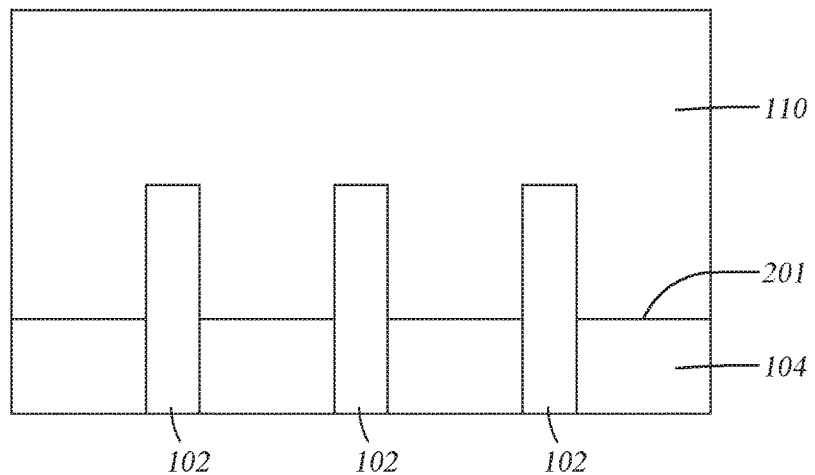
FIGS. 2A-2H illustrate a process for forming a semiconductor device according to one embodiment described herein.
Figure 2B:
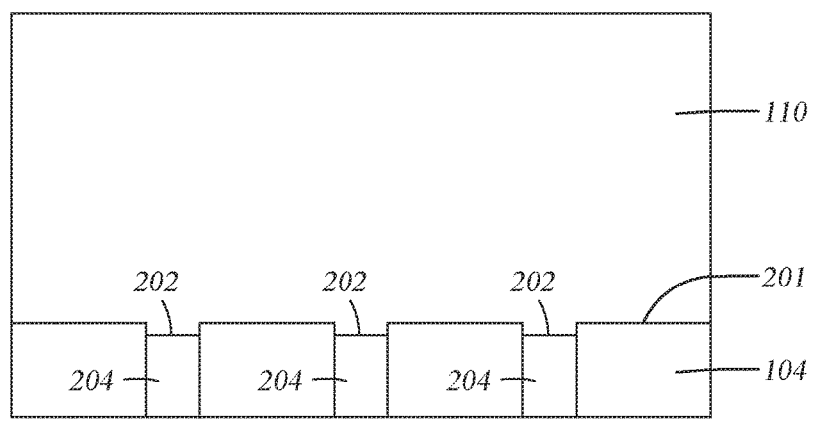

FIGS. 2A-2H illustrate a process for forming a semiconductor device according to one embodiment described herein. FIG. 2A is a side view of the semiconductor structure 100. The semiconductor structure 100 includes the plurality of fins 102 (three are shown) extending over an upper surface 201 of the dielectric material 104 and the gate electrode 110. The gate dielectric 108 and the substrate 101 are omitted for clarity. Next, as shown in FIG. 2B, a portion of each fin 102 is removed to expose a surface 202 of a remaining portion 204 of the fin 102. The removal of the portion of each fin 102 may be by a selective etching process so the gate electrode 110 and the dielectric material 104 are not affected. In other words, the etch chemistry is chosen such that the etch rate of the fin 102 is faster than the etch rates of the gate electrode 110 and the dielectric material 104 since the fin 102, the gate electrode 110, and the dielectric material 104 are made of different materials. The surface 202 of the remaining portion 204 of each fin 102 is recessed from the upper surface 201 of the dielectric material.

Figure 2C:
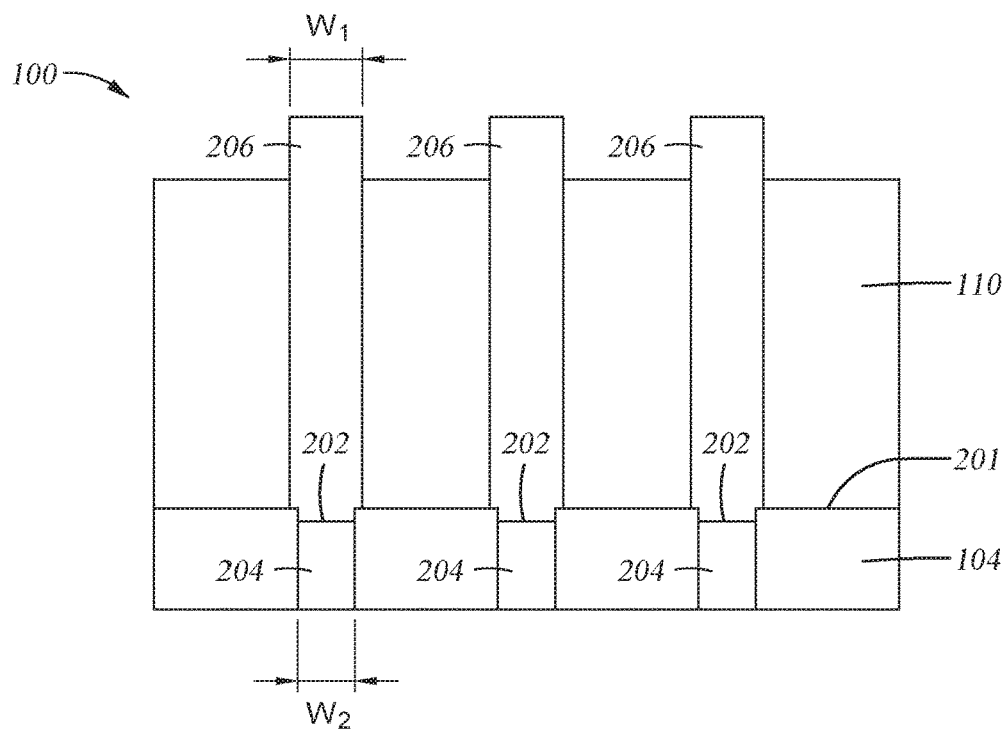

As shown in FIG. 2C, a feature 206, such as a pillar or a ridge, is formed on the surface 202 of the remaining portion 204 of each fin 102. In the view of FIG. 2C, the features 206 appear in the foreground, while the gate electrode 110 appears in the background. Prior to forming the features 206, any native oxides formed on the surfaces 201 and 202 may be removed by a pre-clean process. The features 206 may be formed in an epitaxial deposition chamber. In one embodiment, each feature 206 is formed in by first forming a nucleation layer on the surface 202 of the remaining portion 204 of each fin 102. The substrate 101 (FIG. 1) may have a temperature ranging from about 300 degrees Celsius to about 400 degrees Celsius and the epitaxial deposition chamber may have a pressure less than about 100 Torr during the formation of the nucleation layer. The nucleation layer may have a thickness ranging from about 50 Angstroms to about 100 Angstroms. After the formation of the nucleation layers, the substrate 101 (FIG. 1) is heated to a temperature ranging from about 500 degrees Celsius to about 600 degrees Celsius, the pressure of the epitaxial deposition chamber is reduced to from about 10 Torr to about 40 Torr, and the features 206 are formed. The materials used to form the nucleation layers and the features 206 include group III-V semiconductor materials such as GaAs, InGaAs, InAs, GaP, InP, InGaP, GaSb, InSb, GaAsSb, InAsSb, and other suitable materials. In some embodiments, group II-VI semiconductor materials may be used to form the features 206. Unlike the silicon or germanium based stressor materials, which form a diamond shape due to the different growth rate on different surface planes, the materials used to form the features 206 do not form a diamond shape. The height, width and facets of the features 206 can be controlled by temperature, pressure and/or precursor flow. As shown in FIG. 2C, each feature 206 may have a rectangular cross-section and a substantially constant width $W_1$ over the surface 201 of the remaining portion 204 of each fin 102. The width $W_1$ may be greater than a width $W_2$ of the remaining portion 204 of the fin 102. In one embodiment, the width $W_1$ is about 1 nm to about 10 nm wider than the width $W_2$.

Figure 2D:
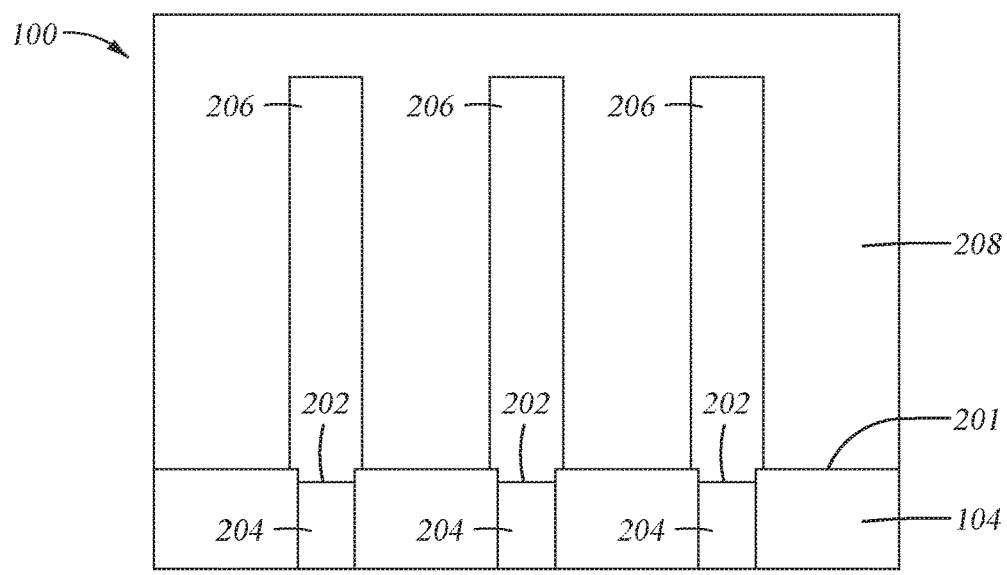
Figure 2E:
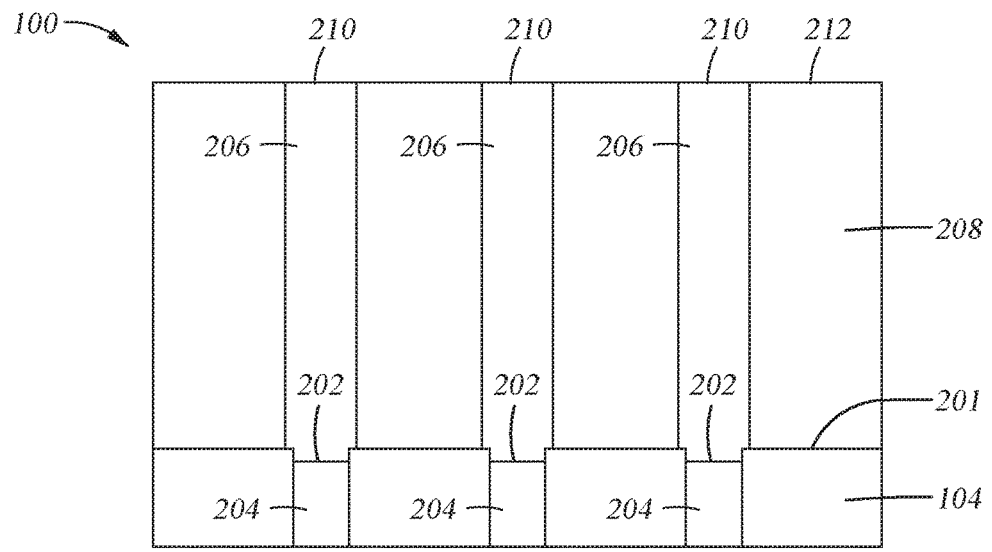

Next, as shown in FIG. 2D, a dielectric material 208 is formed between adjacent features 206. In one embodiment, the dielectric material 208 and the features 206 are coplanar at the end of the deposition process of the dielectric material 208. In another embodiment, the dielectric material 208 is also formed on the features 206 and the gate electrode 110. The dielectric material 208 may be the same material as the dielectric material 104. In one embodiment, the dielectric material 208 is silicon oxide and is deposited by a flowable chemical vapor deposition (FCVD) process. A chemical mechanical planarization (CMP) process is then performed on the dielectric material 208 to expose the features 206, as shown in FIG. 2E. A surface 210 of each feature 206 is exposed, and the surfaces 210 are coplanar with a surface 212 of the dielectric material 208.

Figure 2F:
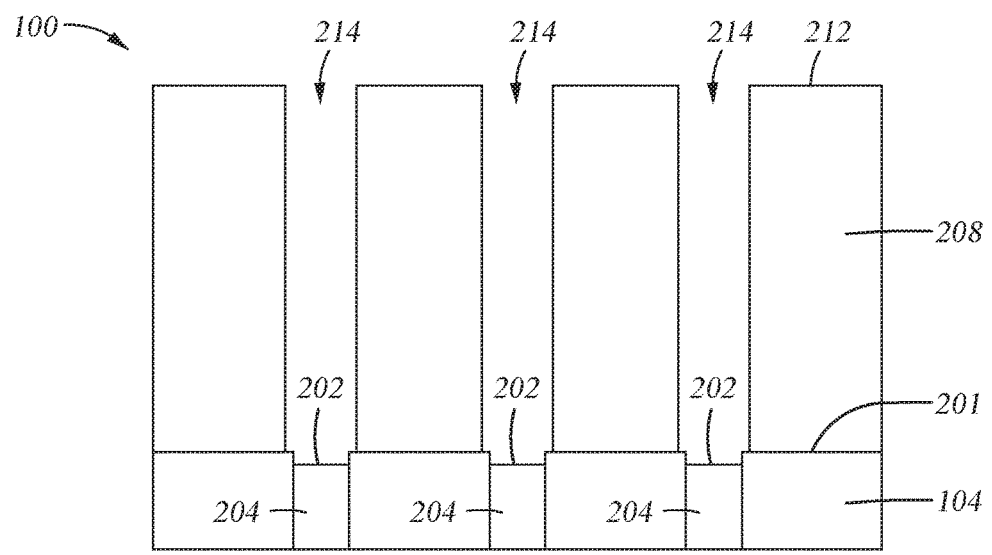
Figure 2G:
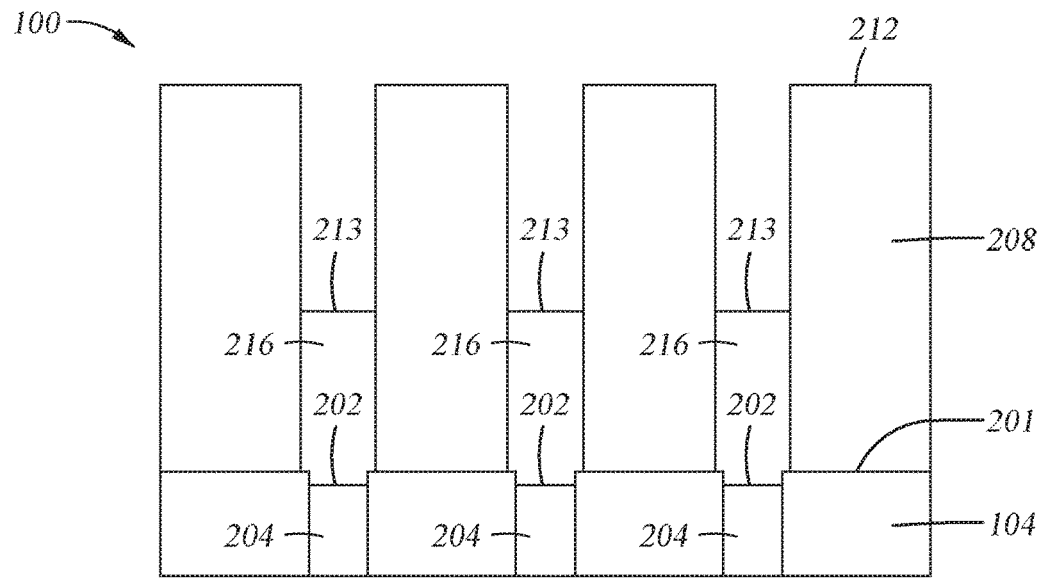

Next, as shown in FIG. 2F, the features 206 are removed to expose the surfaces 202 of the remaining portions 204. The gate dielectric 108 and the gate electrode 110 should appear in the background but are omitted for clarity. The features 206 may be removed by a selective etching process so the dielectric material 208 is not affected. In other words, the etch rate of the feature 206 is much faster than the etch rate of the dielectric material 208 since the feature 206 and the dielectric material 208 are made of different materials. As the result of the removal process, a plurality of openings 214, such as trenches or vias, is formed in the dielectric material 208. Each opening 214 has the same shape as the feature 206. A fill material 216, such as a stressor material, is then deposited in each opening 214 on the surface 202 of the remaining portion 204 of each fin 102, as shown in FIG. 2G. The fill material may be also deposited on the surface 212 of the dielectric material 208, and an etch back process may be performed to remove the fill material deposited on the surface 212 of the dielectric material 208. The fill material 216 may be the source or drain of a FinFET device and may be a silicon and/or germanium based material. In one embodiment, the fill material 216 is an electrically conductive material. The fill material 216 may be formed by an epitaxial deposition process in an epitaxial deposition chamber available from Applied Materials, Inc. The epitaxial deposition process is generally performed by flowing epitaxy precursors such as silane, germane, phosphine, and arsine into the epitaxial deposition chamber and heating the substrate to a temperature, for example 300 degrees Celsius to 600 degrees Celsius, that results in epitaxial deposition on the substrate. For the group III-V semiconductor materials, precursors for the group III elements include halides, which can be reacted with materials such as arsine, phosphine, and stilbene. In one embodiment, the fill material 216 is silicon doped with phosphorus and the FinFET device is an n-type FET. In another embodiment, the fill material 216 is silicon germanium doped with boron or gallium, and the FinFET device is a p-type FET. The shape of the fill material 216 is constrained by the opening 214 that the fill material 216 is formed therein. Thus, instead of having a diamond shape, the fill material 216 has a rectangular cross-section, and the distance between adjacent fill materials 216 is increased. Each fill material 216 has a surface 213 that is recessed from the surface 212 of the dielectric material 208.

Figure 2H:
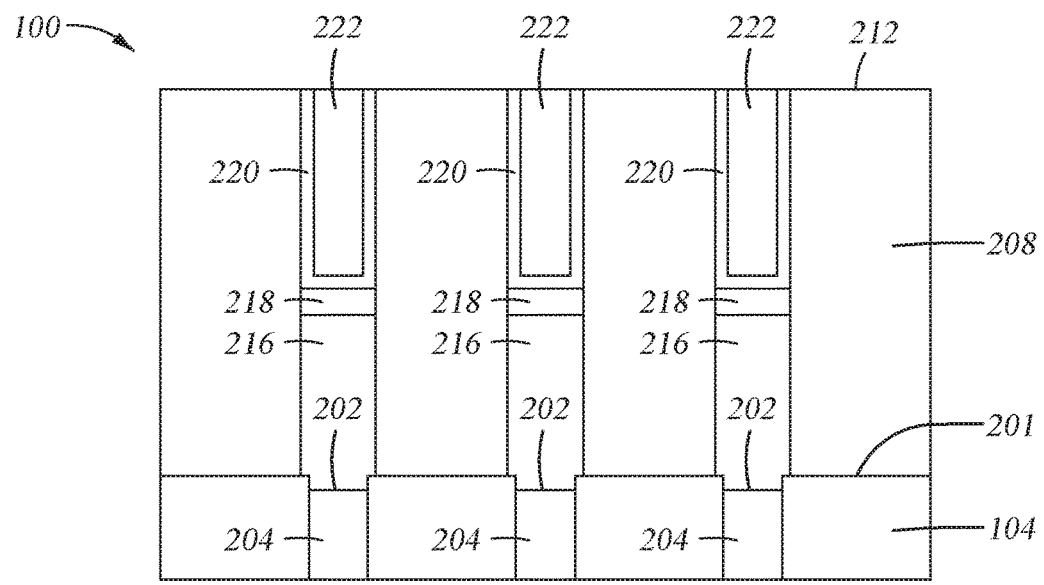

Another benefit of forming the plurality of openings 214 is that any material deposited on the surface 213 of the fill material 216 within the opening 214 is self-aligned. In one embodiment, a metal contact 222 is deposited over the fill material 216 within the opening 214, as shown in FIG. 2H. The metal contact 222 is self-aligned to the fill material 216, i.e., a source or drain, since both the metal contact 222 and the fill material 216 are formed within the opening 214. The metal contact 222 may be fabricated from a metal such as cobalt or tungsten. Additional materials may be formed on the fill material 216 prior to the deposition of the metal contact 222. For example, a silicide or germanide layer 218 may be formed on the fill material 216 by a silicidation process. A liner 220 may be formed conformally in the opening 214 by an atomic layer deposition (ALD) process. The metal contact 222 is then deposited on the liner 220. A CMP process may be performed to planarize the surface.

Figure 3A:
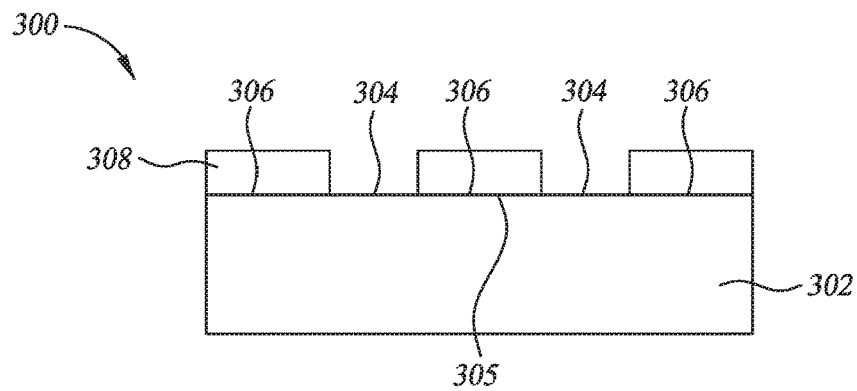
FIGS. 3A-3C illustrate a process for forming a semiconductor device according to another embodiment described herein.
Figure 3B:
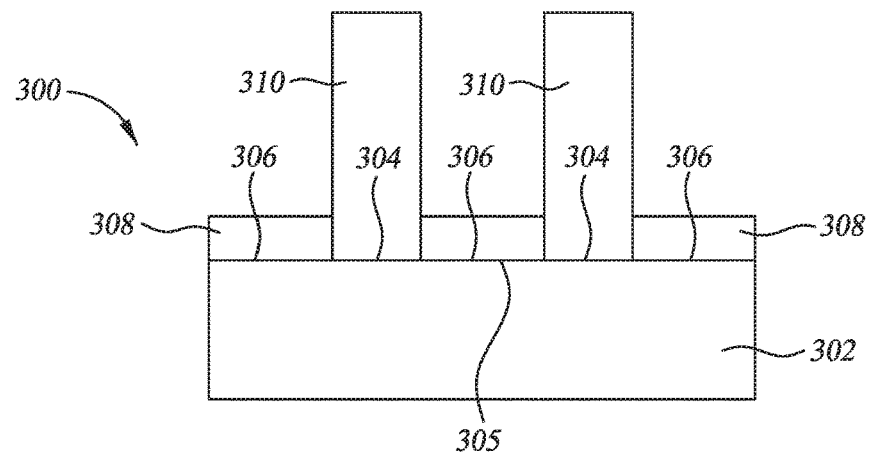
Figure 3C:
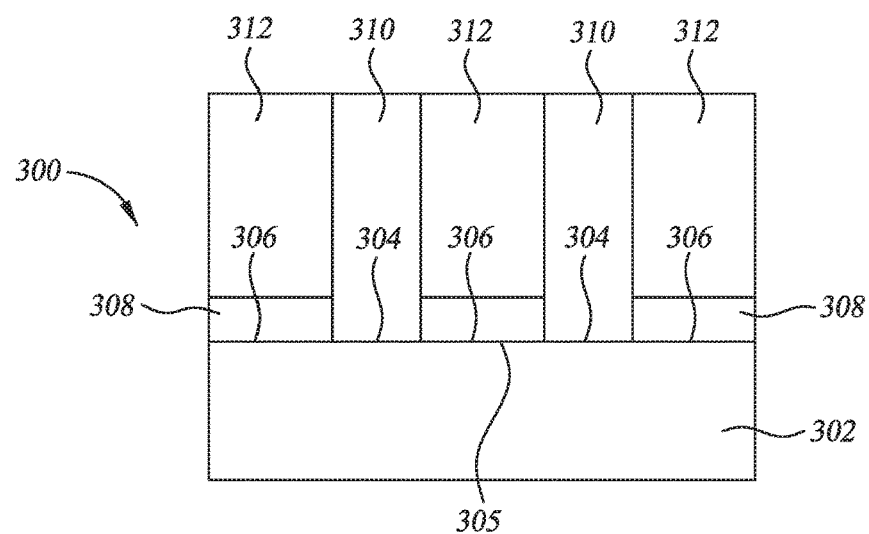

FIGS. 3A-3C illustrate a process for forming a semiconductor device according to another embodiment described herein. FIG. 3A is a side view of the semiconductor structure 300. The semiconductor structure 300 includes a substrate 302 having a semiconductor surface 305. The semiconductor surface 305 includes a plurality of exposed portions 304 separated by a plurality of covered portions 306. In one embodiment, the substrate 302 is a silicon substrate, and the semiconductor surface 305 is a silicon surface. A first dielectric material 308 is disposed on the covered portions 306 of the semiconductor surface 305. The first dielectric material 308 may be silicon oxide, silicon nitride, silicon oxynitride, silicon carbonitride, or any other suitable dielectric material. Next, as shown in FIG. 3B, a feature 310 is formed on each exposed portion 304 of the semiconductor surface 305. The features 310 may be the same as the features 206. Prior to forming the features 310, any native oxides formed on the semiconductor surface 305 may be removed by a pre-clean process. The features 310 may be formed in an epitaxial deposition chamber. In one embodiment, each feature 310 is formed in by first forming a nucleation layer on a corresponding exposed portion 304 of the semiconductor surface 305. The nucleation layer and the features 310 may be formed under the same process conditions as the nucleation layer and the features 206. Unlike the silicon or germanium based materials, which form a diamond shape due to the different growth rate on different surface planes, the materials used to form the features 310 do not form a diamond shape. The height, width and facets of the features 310 can be controlled by temperature, pressure and/or precursor flow.

Next, as shown in FIG. 3C, a second dielectric material 312 is formed between adjacent features 310. In one embodiment, the second dielectric material 312 and the features 310 are coplanar at the end of the deposition process of the second dielectric material 312. In another embodiment, the second dielectric material 312 is also formed on the features 310 and a CMP process is performed on the second dielectric material 312 to expose the features 310. The second dielectric material 312 may be the same material as the dielectric material 208.

Process steps shown in FIGS. 2F, 2G and 2H are then performed on the semiconductor structure 300 to form a plurality of openings in the second dielectric material 312, to deposit a fill material in the plurality of openings, and to deposit a metal in the plurality of openings. The fill material may be the same as the fill material 216, and the metal may be the same as the metal contact 222. The fill material and the metal are self-aligned since both materials are formed within the same opening.

While the foregoing is directed to embodiments of the disclosure, other and further embodiments may be devised without departing from the basic scope thereof, and the scope thereof is determined by the claims that follow.

The invention claimed is:

1. A method, comprising:
   removing a portion of each fin of a plurality of fins formed on a semiconductor substrate to expose a surface of a remaining portion of each fin, wherein the surface is recessed from a surface of a first dielectric material formed adjacent to each fin;
   forming a feature on the surface of the remaining portion of each fin;
   filling gaps between adjacent features with a second dielectric material; and
   removing the features to form a plurality of openings in the second dielectric material, wherein the surface of the remaining portion of each fin is exposed.

2. The method of claim 1, further comprising forming a fill material on the surface of the remaining portion of each fin, wherein each fill material is formed within a corresponding opening of the plurality of openings.

3. The method of claim 2, wherein the fill material is formed in an epitaxial deposition chamber.

4. The method of claim 1, wherein the features are formed in an epitaxial deposition chamber.

5. The method of claim 1, wherein the features are removed by a selective etching process.

6. The method of claim 1, wherein each feature is fabricated from a group III-V semiconductor material or a group II-VI semiconductor material.

7. The method of claim 1, wherein each feature has a first width and each fin has a second width, wherein the first width is greater than the second width.

8. A method, comprising:
   epitaxially forming a feature on each exposed portion of a plurality of exposed portions of a semiconductor surface, wherein the feature comprises a compound semiconductor material, wherein the exposed portions are separated by a first dielectric material disposed on covered portions of the semiconductor surface;
   filling gaps between adjacent features with a second dielectric material;
   removing the features to form a plurality of openings in the second dielectric material, wherein the exposed portions of the semiconductor surface are uncovered; and
   depositing a fill material within each opening.

9. The method of claim 8, further comprising performing a pre-clean process on the exposed portions of the semiconductor surface prior to forming the features.

10. The method of claim 8, wherein the features are formed in an epitaxial deposition chamber.

11. The method of claim 8, wherein the features are removed by a selective etching process.

12. The method of claim 8, wherein the fill material is formed in an epitaxial deposition chamber.

13. The method of claim 8, wherein the fill material comprises a semiconductive material or a conductive material.

14. A method, comprising:
  removing semiconductor pillars to form a plurality of trenches in a dielectric material formed adjacent to the semiconductor pillars, wherein a semiconductor surface comprising a fin material is exposed in each trench;
  forming a conductive source or drain material on each exposed semiconductor surface, wherein each source or drain material is formed within a corresponding trench of the plurality of trenches; and
  forming a metal contact over each source or drain material, wherein the metal contact and a corresponding source or drain material are aligned within a corresponding trench of the plurality of trenches, and wherein a portion of each source or drain material proximate the metal contact has a rectangular cross-section.

15. The method of claim 14, further comprising forming a silicide or germanide layer on each source or drain material prior to forming the metal contact over each source or drain material.

16. The method of claim 15, further comprising forming a liner on the silicide or germanide layer prior to forming the metal contact over each source or drain material.

17. The method of claim 16, wherein the metal contact is formed on the liner.

18. The method of claim 16, wherein the metal contact comprises cobalt or tungsten.

19. The method of claim 14, wherein the semiconductor pillars are removed by a selective etching process.

20. The method of claim 14, wherein the source or drain material is formed in an epitaxial deposition chamber.

* * * * *